(12) United States Patent
Brintzinger et al.

(10) Patent No.: US 7,368,375 B2
(45) Date of Patent: May 6, 2008

(54) ELECTRONIC COMPONENT WITH COMPLIANT ELEVATIONS HAVING ELECTRICAL CONTACT AREAS AND METHOD FOR PRODUCING IT

(75) Inventors: Axel Brintzinger, Dresden (DE); Stefan Ruckmich, Dresden (DE); Octavio Trovarelli, Dresden (DE)

(73) Assignee: Infineon Technologies AG, Munich (DE)

( * ) Notice: Subject to any disclaimer, the term of this patent is extended or adjusted under 35 U.S.C. 154(b) by 329 days.

(21) Appl. No.: 10/997,761

(22) Filed: Nov. 24, 2004

(65) Prior Publication Data

US 2005/0127521 A1  Jun. 16, 2005

(30) Foreign Application Priority Data

Nov. 27, 2003  (DE) ................................ 103 56 119

(51) Int. Cl.
*H01L 21/31* (2006.01)

(52) U.S. Cl. .................. 438/613; 438/106; 438/108; 438/622; 257/E23.068

(58) Field of Classification Search ............... 438/106, 438/108, 613, 622
See application file for complete search history.

(56) References Cited

U.S. PATENT DOCUMENTS 5,685,885 A    11/1997  Khandros et al.
2003/0067755 A1*  4/2003  Haimerl et al. ............. 361/773

FOREIGN PATENT DOCUMENTS

WO    WO 01/75969 A1    10/2001

* cited by examiner

*Primary Examiner*—Alexander Ghyka
(74) *Attorney, Agent, or Firm*—Slater & Matsil, L.L.P.

(57) ABSTRACT

An electronic component includes compliant elevations having electrical contact areas for contact-connecting the component to an electronic circuit. The compliant elevations are arranged on a surface of the component and the electrical contact areas are arranged on the tip of the compliant elevations. The electrical contact with the electronic circuit is embodied by means of electrical conductive tracks arranged on the surface of the component. The conductive tracks ascend on the outer surfaces of the compliant elevations to the electrical contact areas.

23 Claims, 3 Drawing Sheets

FIG 1A
Prior Art
FIG 1B
Prior Art
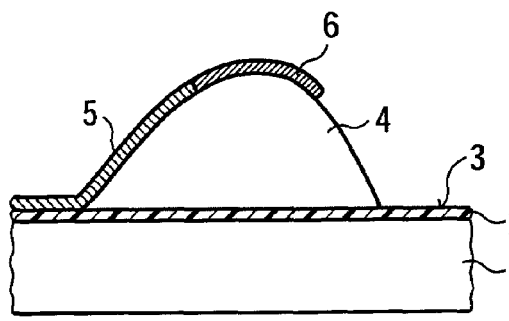
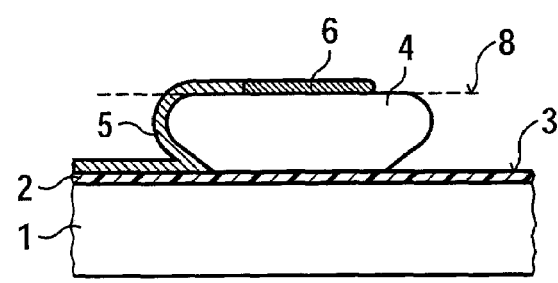
FIG 2A
FIG 2B
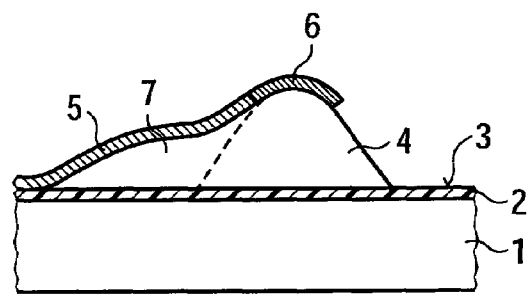
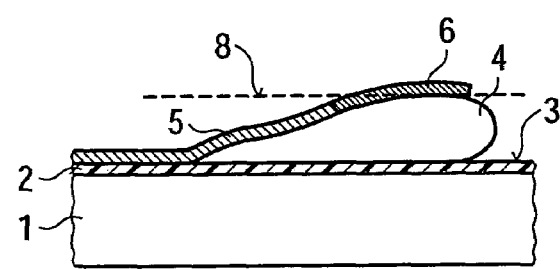

ELECTRONIC COMPONENT WITH COMPLIANT ELEVATIONS HAVING ELECTRICAL CONTACT AREAS AND METHOD FOR PRODUCING IT

This application claims priority to German Patent Application 103 56 119.6, which was filed Nov. 27, 2003 and is incorporated herein by reference.

TECHNICAL FIELD

The invention relates to an electronic component with compliant elevations having electrical contact areas for contact-connecting the component to an electronic circuit.

BACKGROUND

Electronic components are increasingly being used as so-called wafer level packages or chip size packages. In order to meet the constant demand for ever smaller component dimensions, these components do not have housings but at most protective passivation or plastic layers, so that the dimensions thereof correspond precisely or virtually to those of the contained integrated circuit (chip). The integration of these components is effected by means of electrical contact areas that are preferably arranged in gridlike fashion and are electrically connected to the actual, primary contacts of the component via conductive tracks forming a rewiring plane.

The integration of such components in an electronic circuit is preferably effected by means of the known flip-chip technology. In this case, the chips are positioned with the side having the electrical contact areas downwards on the contact pads of a printed circuit board which correspond to the contact areas, and all contacts are produced simultaneously by means of a previously applied solder or conductive adhesive by component and substrate being joined to one another and soldered under the action of pressure and temperature.

The normal and shear stresses that act on the soldering connections and occur during the connecting process and, in particular, during later instances of thermal loading, for example during the artificial pre-ageing (burn-in), and are caused by the different thermal expansions of the connected materials of the component and the printed circuit board and also by possible unevennesses of the component are intended to be compensated for by preferably rubberlike, compliant elevations. The rubber-elastic properties of the elevations, which are manifested in the reversible deformability thereof, make it possible to take up and compensate for the mechanical stresses acting on the elevations. In most applications, this stress compensation has to be effected exclusively by the compliant elevations since such components, as described, do not have any further housing elements that would be suitable for compensating for or taking up the aforementioned stresses.

By way of example, such a component is described in WO 01/75969 A1, which corresponds to U.S. Patent Application Publication 2003/0067755, which applications are incorporated herein by reference. Accordingly, compliant elevations are arranged in the grid structure of the electrical contact areas and have a hill-like form and also mechanical properties comparable with those of rubber or silicone. The crest of each compliant elevation of an electronic component is covered with an electrically conductive contact area, proceeding from which a conductive track, following the slope, runs as far as the surface of the component where it realizes, together with the conductive tracks proceeding from the other compliant elevations of the component, the rewiring of the contact areas to the primary electrical contacts of the component.

However, since the conductive tracks run along the slope surface of the compliant elevations, the latter must also be able to follow compensating displacements or deformations of the compliant elevations. While that is ensured by means of conductive tracks that ascend spirally, by way of example, their transitions from the surface of the component to the compliant elevation are problematic. In particular, the pressing-together during the joining process described leads to deformations of the compliant elevation, so that, during the process, the periphery of the structure is altered in the central region and the conductive track is mechanically overloaded on account of this at the base point, which may lead to the fracture of the conductive track and to the failure of the contact.

In order to completely avoid the formation of such a critical base point, U.S. Pat. No. 5,685,885, which is incorporated herein by reference, by way of example, provides a compressible layer instead of the discrete compliant elevations, which layer covers the surface of the chip on which the contact pads thereof are arranged, and which leaves the contact pads free. The compressible layer in turn comprises further contact pads via which the integration of the chip is realized by means of solder or conductive adhesive. The electrical connection between the contact pads of the chip and those of the compressible layer is produced via flexible conductors that are routed arcuately and are encapsulated for protection each individually including the respective contact pad of the chip.

Besides the higher space requirement and the need to insert a further element for rewiring of the chip connections, such a complicated arrangement has the significant disadvantage that various additional method steps are necessary which each intrinsically may entail further reliability problems and require a high expenditure in terms of costs and time.

SUMMARY OF THE INVENTION

In one aspect, the invention specifies an electronic component that has reliable electrical connections between the contacts serving for the integration of the component into an electronic circuit and the primary contacts of the component and at the same time can be produced cost-effectively by means of the known method steps.

According to the preferred embodiment of the invention, at least one compliant elevation of the electronic component has, in its lower section, a spur extending at least in the region in which the conductive track undergoes transition from the surface of the electronic component to the outer surface of the compliant elevation, and that the outer surface of the spur has, along the path of the conductive track, a rise that is positive at every point and is smaller than the average rise of the outer surface of the compliant elevation.

On account of the wetting behavior of the materials of the component and the compliant elevation, the transition from one to the other in practice will not be able to be embodied in a sliding manner, that is to say with a gradually rising rise, but rather will always constitute a jump that is greater the less space is available for the elevation, and therefore the edge rise of the elevation is all the steeper. For this reason, in the region of the spur of the compliant elevation, the spur being essential to the invention, the jump in the rise is divided between two transitions and the risk of buckling during the pressing-together in the context of the customary process for joining the component and the second joining partner is thus prevented.

What is essential to the preferred embodiment of the invention in this case is that, owing to the arrangement of the spur, the compliant elevation has a plan that is asymmetrical with respect to the electrical contact area arranged on the crest, and, in this case, the asymmetrical projection extends in the direction from which the conductive track meets the outer surface of the compliant elevation. This asymmetrical form of the elevation has the effect, in connection with the shallower rise in the region of the spur, that the pressing-together of the elevation in the direction of the surface of the component results in the aforementioned blisterlike deformation only in the region outside the spur and the spur itself only loses height. Since the spur is arranged, according to the invention, in the section of the compliant elevation in which the conductive track meets the elevation, the conductive track is no longer buckled at the transition to the spur, but rather only rises more shallowly.

The reduction of the region having a smaller rise only to a spur of the elevation makes it possible, moreover, that the customary small grid widths of the arrangement of the compliant elevations of the electronic device can nevertheless be maintained since spurs can extend into the grid interspaces, which ensure the necessary space requirement. The conductive tracks can accordingly be adapted by corresponding patterning of the rewiring embodied in one plane.

If, in accordance with a particularly favorable embodiment, the spur of the compliant elevation of the electronic component according to the invention has a height amounting to one third to one half of the height of the compliant elevation, then the spur brings about as it were an approximate halving of the change in the rise during the transition of the conductive track from the surface of the component to the elevation. The remaining adaptation of the rise is effected in the case of the second transition, from the spur to the upper section of the elevation. If, in addition, the compliant elevations are compressed to a height that is greater than the height of the spur, then the spur and thus also the course of the conductive track on the spur are influenced only to an insignificant extent by the compression, as a result of which the reliability of the electrical contacts is decisively improved.

In particular embodiments of the invention, it is provided that either all the spurs of an arrangement of compliant elevations have the same form and size and/or are oriented in the same way, or that the spurs of an arrangement of compliant elevations are arranged, with regard to their size and/or form and/or orientation, in accordance with the direction of action of the shear stresses that occur in the load case.

By means of a targeted reliability test of the soldering connections or other suitable measures, it is possible to determine a loading distribution over the arrangement of the compliant elevations of an electronic component and to define the arrangement and/or the lateral extent of the individual spurs of an arrangement in order, if appropriate, to combat voltage spikes in a targeted manner.

Shear stresses that occur bring about, for example, a lateral displacement of the compliant elevation, which, in the worst case scenario, if the shear stress acts in the direction of the spur, may have the effect that the blisterlike deformation that causes the buckling of the conductive track also occurs in the region of the spur and thus of the conductive track. In this case, the relevant soldering connections may be embodied reliably again if the spur, by way of example, is positioned counter to the direction of action of the shear stress, relative to the center point of the compliant elevation, and is thus not compressed in the direction of the conductive track.

In a particularly advantageous embodiment, the conductive track, after the transition from the surface of the electronic component to the outer surface of the spur, is formed in a manner ascending spirally on the common outer surface of spur and elevation. In this case, the conductive track will not ascend on the ridge of the spur, which corresponds to a favorable embodiment but is not necessary, as long as the described mediation of the rise is also ensured in the pressed-together state. By virtue of rising spirally, the conductive track itself can take up tensile stresses in particular due to shear stresses, which leads to a further improvement in the reliability of the soldering connection.

In principle, it is possible for the compliant elevations also to be formed from an elastomer or from a silicone rubber. The materials used must in any event ensure a rubber-elastic expansibility which, even under changing temperature load, enables a pressing-together in the direction that is normal to the surface and likewise, if appropriate simultaneously, a displacement of the electrical contact area on its crest in the lateral direction without the compliant elevation itself breaking or tearing away from the surface of the component.

Likewise, it is both possible for the electronic component to be a semiconductor component or for it to be a polymer component. In accordance with the respective connection conditions of the relevant electronic component, it is accordingly also possible to adapt the formation of the electrical contact area on the crest of the compliant elevation. Thus, a conductive pin or a conductive ball are likewise possible, as is electrically conductive adhesive.

In terms of method technology, the compliant elevations are applied by a printing process by means of a perforated stencil, in a manner similar to that in the case of screen-printing. This method is a tried and tested and above all cost-effective method in the case of which, through customary process control and corresponding material variance, the properties of the elevations can be set in accordance with the application. The hill-shaped elevations known hitherto are produced by at least two successive printing processes of this type in that the starting substance with identical or lower viscosity is printed with preferably one stencil in the first process and, on account of its flow properties of the bottommost layer of the surface of the component and/or on account of the lower viscosity, this first layer arises with an extent larger than the stencil opening. At least one further layer is applied to this first layer, the flow of this layer, on account of the first layer now serving as a support and/or on account of the lower viscosity of the material used in this process, being less than that in the case of the first layer and, consequently, the second layer having a smaller extent than the first layer. In this way, further layers with a respectively decreasing extent are applied, if appropriate, until the required height of the compliant elevation is reached and this leads to the desired hill-like shape.

This method can also furthermore be used for producing the compliant elevations according to the invention if at least the first stencil is changed in such a way that its opening has the plan of the elevation including the spur extending in the preferred direction. In this case, it is likewise possible to choose the opening size of the perforated stencil modified in this way, in accordance with the use of a starting material of lower viscosity, to be smaller than the elevation is intended to assume in the finished state, or else to choose the opening to be larger and virtually in accordance with the finished dimensions of the elevation.

It proves to be particularly advantageous if, during the application of the elevation in at least two successive printing processes, the first and second perforated stencils of the first and second printing processes have corresponding openings and the openings of the first perforated stencil differ from the openings of the second perforated stencil by virtue of the fact that a basic passage of uniform form in the first perforated stencil is supplemented by a further passage that asymmetrically overlaps the basic passage, the center points of the passages, which form a common opening, being arranged in a manner displaced with respect to one another.

The mutually overlapping passages of the first perforated stencil may be simple geometrical figures which, in plan view, by way of example, produce a noselike extension of the basic passage. By virtue of the fact that this basic passage is also present in the second and, if appropriate, further perforated stencils and furthermore in a corresponding manner in the sense of corresponding center points, this nose, in accordance with the set viscosity of the starting substance of the first process, forms the spur in the desired extent and above all with the desired smaller rise.

In this case, it is of particular significance to choose the overlap of the two passages with a magnitude such that, when considered in horizontal section, the surface of the spur has a course that always has a rise with a uniform sign, preferably a positive rise in the case of a correspondingly taken section.

Utilizing the altered flow behavior depending on the support and choosing a starting substance with lower viscosity has the advantage that the basic passage can have the same form and dimension for the first and each further stencil and the overlapping passage has to be added only in the first stencil.

The production of the hill-like form—which has proved to be favorable—of the compliant elevation with a noselike spur is achieved, in a particularly advantageous method according to a preferred embodiment of the invention, by virtue of the fact that the basic passages of the first stencil are supplemented by asymmetrically overlapping passages in the form of an ellipse and the basic passages of the second stencil are the same concentric circles with identical positioning as those of the first perforated stencil. In accordance with the described premise of the arrangement of the individual passages, in the stencil forming the spur, the center point of the ellipse should preferably be positioned on the outer third to quarter of the radius of the basic, circular passage. In this case, the direction in which the two passages are displaced relative to one another may be defined, as already explained, in accordance with the stress distribution present on the individual compliant elevations of the arrangement of the component.

It is likewise possible once again for the displacements of the center points of the passages in the first perforated stencil to have the same direction and/or the same magnitude for all compliant elevations of the electronic device, which will be the case given an at least virtually uniform stress distribution for example with small components.

It goes without saying that it is likewise possible, in each of the embodiments described, to produce the spur in a plurality of successive printing steps, either with a uniform stencil and different flow of the printing substances or with stencils that have different opening sizes with a corresponding position of the openings.

BRIEF DESCRIPTION OF THE DRAWINGS

The invention will be explained in more detail below on the basis of an exemplary embodiment. In the associated drawing:

FIGS. 1a) and b) show the diagrammatic illustration of a horizontal section through an electronic component of the previously known type in the unloaded and compressed state;

FIGS. 2a) and b) show the diagrammatic illustration of a horizontal section through an electronic component according to the invention in the unloaded and compressed state;

Figure 3A:
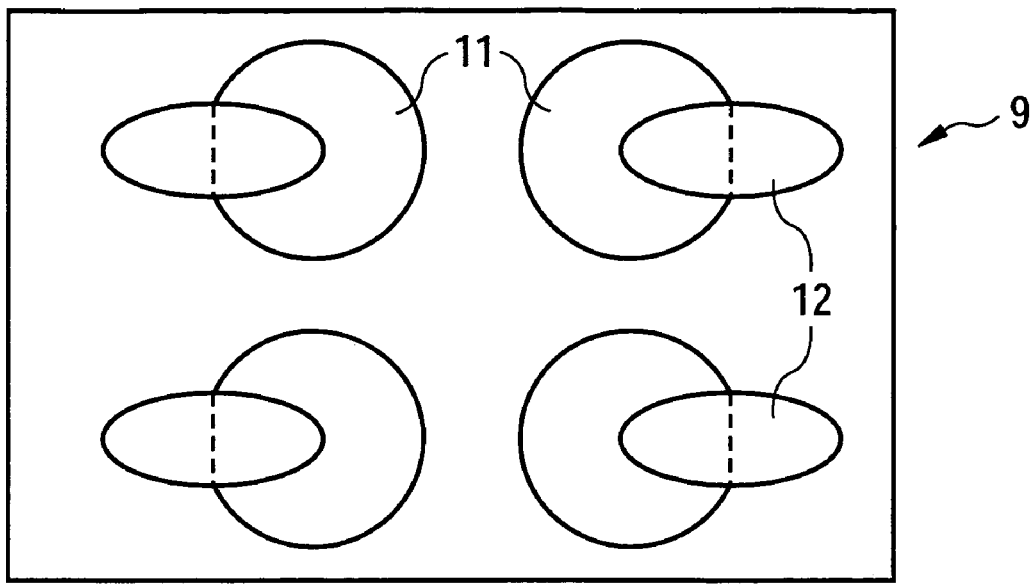
FIGS. 3a) and b) show the plan view of a detail from the first and a further perforated stencil for producing compliant elevations arranged in the grid by printing technology.

The following list of reference symbols can be used in conjunction with the figures
1 Component
2 Insulating layer
3 Surface
4 Elevation
5 Conductive track
6 Electrical contact area
7 Spur
8 Final height of compression
9 First perforated stencil
10 Second perforated stencil
11 Basic passage
12 Overlapping passage
13 First layer
14 Second layer
15 Third layer

DETAILED DESCRIPTION OF ILLUSTRATIVE EMBODIMENTS

FIG. 1 a) illustrates an electronic component in accordance with the prior art, which comprises the component 1 in the form of a semiconductor or polymer component, covered by an insulating layer 2, and on one surface 3 of which extends a symmetrical, hill-shaped elevation 4 made of compliant material. A conductive track 5 running on the surface 3 of the component 1 above the insulating layer 2 continues on the edge of the compliant elevation 4 and ends in the electrical contact area 6 areally covering the crest of the elevation 4.

FIG. 1 b) illustrates this compliant elevation 4 in the compressed state. As occurs during joining, test and burn-in processes for integration of the electronic component. The compression has been effected to somewhat more than half of the original height in the example illustrated. On account of the compression, the compliant elevation 4 has been deformed and assumed the shape of a blister pressed flat. On account of this deformation, the hill-like electrical contact area 6 has been reshaped into a planar area and the conductive track 5, the course of which on the edge of the elevation 4 has likewise been adapted to the new form of the elevation 4, has, in the transition from the surface 3 of the component 1 to the edge of the elevation 4, a buckling that may cause an interruption of the conductive track 5.

FIG. 2 a) illustrates an electronic component according to the invention, having an asymmetrical compliant elevation 4. The compliant elevation 4 extends on the surface 3 of the component 1, which is once again covered by an insulating layer 2. It has a spur 7 laterally and the electrical contact area 6 on the crest. The spur 7 has a significantly flatter, extended form in comparison with the entire elevation 4, which has the consequence that the conductive track 5, which runs from the surface 3 of the component 1 in a manner following the ridge of the spur 7 as far as the electrical contact area 6, rises virtually continuously.

As illustrated in FIG. 2 b), the conductive track 5 retains this essentially continuous rise even in the compressed state of the compliant elevation 4 since the height of the spur 7 in the uncompressed state lies below the final height of the compression and the blisterlike deformation in the case of the customary compressions can be observed only at the steep edge of the elevation 4.

The details from two perforated stencils 9, 10, called stencils hereinafter, which serve for producing compliant elevations 4 illustrated in FIG. 2a), can be seen in FIGS. 3 a) and 3 b). The two stencils 9, 10 have, as basic passages 11, four circular openings that are arranged uniformly and in gridlike fashion and are additionally positioned identically on the two stencils 9, 10. In the first stencil 9 in accordance with FIG. 3 a), these basic passages 11 are in each case supplemented by an elliptical passage 12 overlapping the basic passage 11. In the present exemplary embodiment, the overlapping passage 12 has a maximum ellipse radius that approximately corresponds to the radius of the basic passage 11. In this case, the overlapping passage 12 is always arranged in such a way that its center point is situated approximately on one of the two points of intersection between the periphery of the basic passage 11 and its horizontal axis. In this case, the same point of intersection is respectively chosen for two openings arranged in a vertical row, so that the openings of one row correspond to those of the second row in mirror-inverted fashion and the spurs 7 lie on the side remote from the second row. The second stencil 10 in FIG. 3 b) does not have any overlapping passages 12 in addition to the basic passages 11.

Figure 3B:
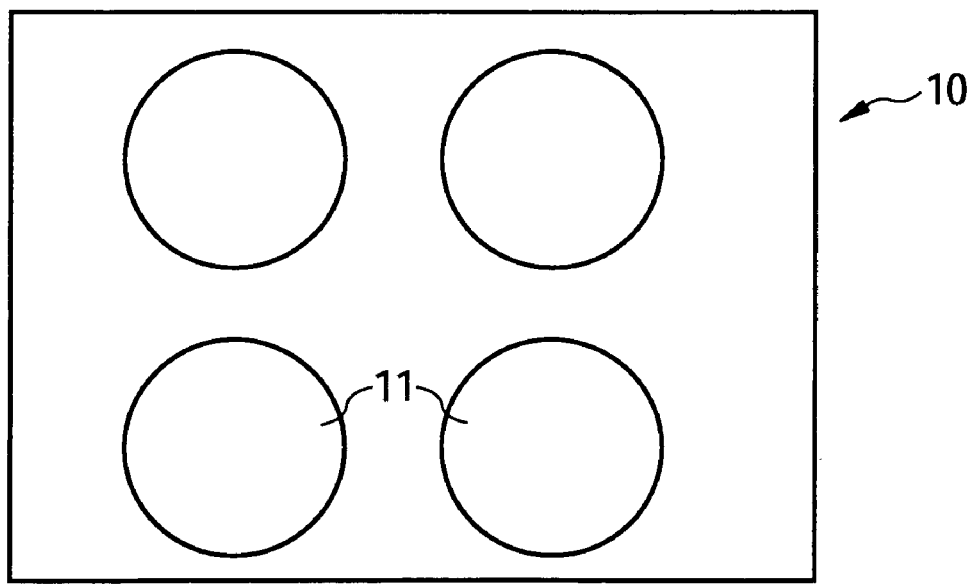
Figure 4A:
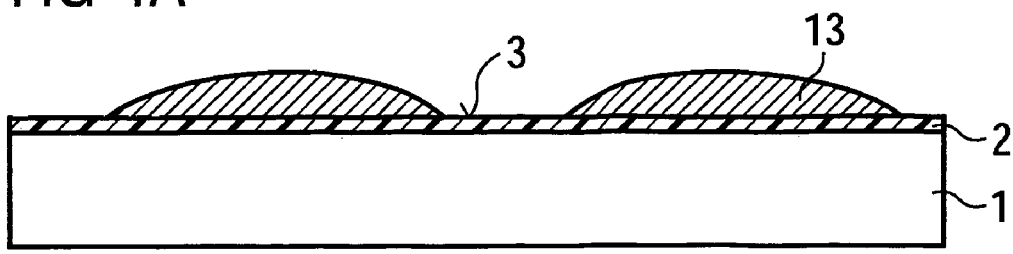
FIGS. 4a) to d) show the production of compliant elevations with conductive tracks and electrical contact areas in four work steps.
Figure 4B:
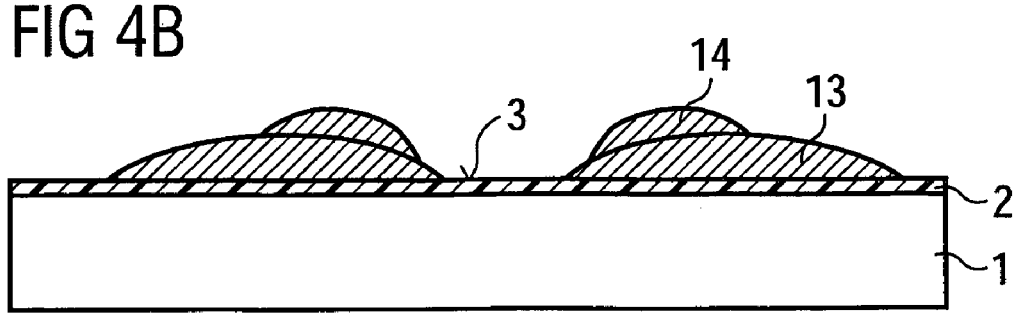
Figure 4C:
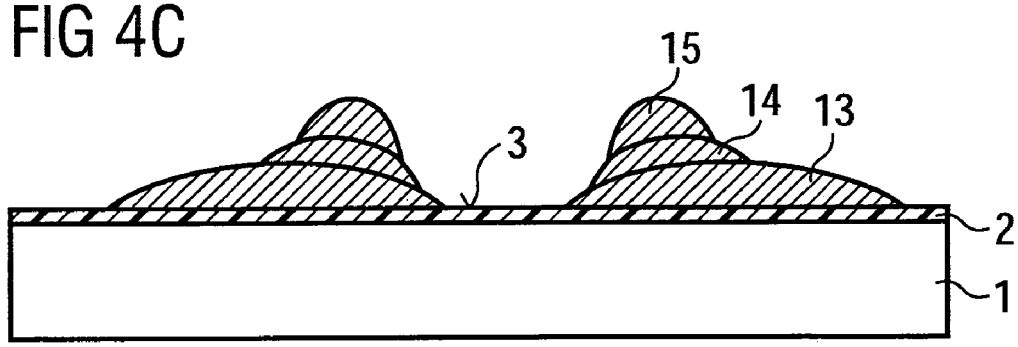
Figure 4D:
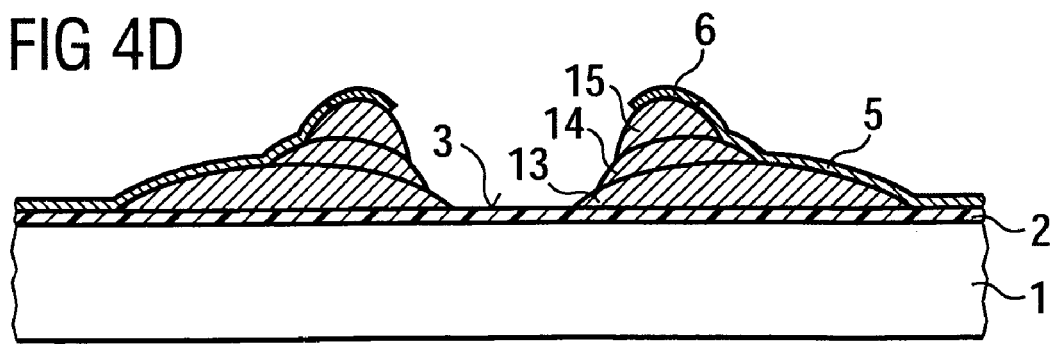

The perforated stencils 9, 10 in accordance with FIGS. 3 a) and b) serve as printing stencil for printing application of the compliant elevations 4 in three process steps that are coordinated with one another and the results of which are illustrated in FIGS. 4 a) to c).

In the present exemplary embodiment, an electronic component 1, for example a semiconductor chip, is coated on its active side with an insulating layer 2, in this case a passivation layer, in a known manner that is not illustrated in any greater detail, the primary contacts (not illustrated in the drawing) of the chip remaining free. On the surface 3 of the insulating layer 2, which at the same time constitutes the surface of the electronic component 1, a first layer 13 of the compliant elevation 4 is applied by means of the first perforated stencil 9 that can be seen in FIG. 3 a). By means of targeted setting of the viscosity of the starting material, for example a silicone rubber, the dimensions and the height of the elevation 4 in the final state are determined since this utilizes the running of the starting substance until the desired solidification in a targeted manner.

A second layer 14 that continues the formation of the elevation 4 is applied in a second printing step by means of the second perforated stencil 10 that is illustrated in FIG. 3 b) and is positioned in such a way that its circular openings correspond to the positions of the circular basic passages 11 of the first stencil 9. In this case, the same silicone rubber composition as for the first layer is used, but this second layer 14 runs on the first layer 13 to a lesser extent than on the surface of the electronic component 11, so that the second layer 14 on each elevation 4 has smaller dimensions than the first layer 13.

In a third printing process corresponding to this second step, a third layer 15, forming the crest of the elevations, of the same silicone rubber is once again applied with the second perforated stencil 10 in the same position. On account of the once again reduced flow of this third layer 15, the latter likewise has smaller dimensions than the previous, second layer 14. Consequently, hill-shaped compliant elevations 4 are produced which in each case have a shallowly rising spur 7 approximately in their lower third.

By means of known and suitable metallization and patterning methods, the electrical contact areas 6 including an areal metallization are applied to the surface 3 of the component and to the compliant elevations 4 and patterned in such a way as to form the conductive tracks 5 that produce the electrical connection between the primary contacts (not illustrated) of the electronic component and the electrical contact areas 6 on the crests of the compliant elevations 4 (FIG. 4 d)).

What is claimed is:

1. A method for producing an electronic component, the method comprising:
   forming compliant elevations on a surface of an electronic component;
   forming a plurality of spurs, wherein each spur is adjacent to one of the compliant elevations and disposed asymmetrically relative to each one of the compliant elevations; and
   forming a conductive line over the surface of the electronic component and the compliant elevations, the conductive line forming electrical contact areas arranged on tips of the compliant elevations and electrical conductive tracks arranged on the surface of the electronic component and electrically coupling the electrical contact areas to contact regions of the electronic component, wherein the electrical conductive tracks ascend from the surface of the electronic component over the spurs to an outer surface of the compliant elevations to the electrical contact areas.

2. The method of claim 1, wherein the compliant elevations are formed by a printing process by means of a perforated stencil.

3. The method of claim 2, wherein the compliant elevations are formed by application in at least two successive printing processes including a first printing process with a first perforated stencil and a second printing process with a second perforated stencil, the first and second perforated stencils of the first and second printing processes having corresponding openings wherein the openings of the first perforated stencil differ from the openings of the second perforated stencil by virtue of the fact that a basic passage of uniform form in the first perforated stencil is supplemented by a further passage that asymmetrically overlaps the basic passage, and wherein the center points of the passages, which form a common opening, are arranged in a manner displaced with respect to one another.

4. The method of claim 3, wherein the basic passages of the first and second perforated stencils are circles and the asymmetrically overlapping passage of the first perforated stencil is an ellipse.

5. The method of claim 3, wherein the displacements of the center points of the passages in the first perforated stencil have a same direction and/or a same magnitude for all elastic elevations of the electronic component.

6. The method of claim 1, wherein forming the compliant elevations comprises:
forming a series of first compliant elevation regions over the surface of the electronic component; and
forming a series of second compliant elevation regions over the surface of the electronic component such that each second compliant elevation region overlies a first compliant elevation region.

7. The method of claim 6, further comprising forming a series of third compliant elevation regions over the surface of the electronic component, wherein each third compliant elevation region overlies each of the second compliant elevation regions, and wherein the electrical conductive tracks extend over the third compliant elevation regions.

8. The method of claim 6, wherein forming the series of first compliant elevation regions comprises performing a first printing process using a first perforated stencil, and wherein forming the series of second compliant elevation regions comprises performing a second printing process using a second perforated stencil.

9. The method of claim 8, wherein the first perforated stencil includes a plurality of substantially circular passages and a plurality of secondary passages, each secondary passage overlapping one of the substantially circular passages, and wherein the second perforated stencil includes a plurality of substantially circular passages.

10. The method of claim 9, wherein each secondary passage asymmetrically overlaps one of the substantially circular passages of the second perforated stencil.

11. The method of claim 6, wherein the first and second compliant elevation regions comprise silicone-based elastomers.

12. The method of claim 1, wherein an outer surface of each spur has, along a path of a respective electrical conductive track, a rise that is positive at every point and is smaller than an average rise of the outer surface of the compliant elevations.

13. The method of claim 1, wherein each spur has a height amounting to about one third to one half of a height of the compliant elevation to which it is adjacent.

14. The method of claim 1, wherein all of the spurs of the plurality of spurs have a same form and size.

15. The method of claim 1, wherein each spur of the plurality of spurs is oriented in a same manner relative to its associated compliant elevation.

16. The method of claim 1, wherein each of the plurality of spurs is arranged, with regard to its size and/or form and/or orientation, in accordance with a direction of action of shear stresses that occur in a load case.

17. The method of claim 1, wherein each electrical conductive track, after transitioning from the surface of the electronic component to an outer surface of each spur, is formed in a manner ascending spirally on a common outer surface of each spur and the respective compliant elevation.

18. The method of claim 1, wherein the compliant elevations are formed from an elastomer.

19. The method of claim 18, wherein the compliant elevations are formed from a silicone-based elastomer.

20. The method of claim 1, wherein the electronic component comprises a semiconductor component.

21. The method of claim 1, wherein the electronic component comprises a polymer component.

22. A method for producing an electronic component, the method comprising:
forming an insulating layer over the electronic component;
forming an asymmetric compliant elevation over a portion of a top surface of the insulating layer, wherein the asymmetric compliant elevation extends above the top surface, and wherein sidewalls of the asymmetric compliant elevation rise substantially continuously on a first side but not on an opposite side;
forming a conductive track over the insulating layer and over the asymmetric compliant elevation, the conductive track extending to a crest on the asymmetric compliant elevation; and
forming electrical contact areas contacting the conductive track on the crest on the asymmetric compliant elevation.

23. The method of claim 22, wherein forming the asymmetric compliant elevation comprises compressing the asymmetric compliant elevation, wherein the compressing buckles the sidewalls of the asymmetric compliant elevation on the opposite side.

* * * * *

UNITED STATES PATENT AND TRADEMARK OFFICE
CERTIFICATE OF CORRECTION

PATENT NO. : 7,368,375 B2  Page 1 of 1
APPLICATION NO. : 10/997761
DATED : May 6, 2008
INVENTOR(S) : Brintzinger et al.

It is certified that error appears in the above-identified patent and that said Letters Patent is hereby corrected as shown below:

In Col. 8, lines 29-30, delete "asynimetrically" and insert --asymmetrically--.

Signed and Sealed this

Eighth Day of July, 2008

JON W. DUDAS
*Director of the United States Patent and Trademark Office*